(12) United States Patent
Iwasaki

(10) Patent No.: US 7,333,562 B2
(45) Date of Patent: Feb. 19, 2008

(54) NONLINEAR DISTORTION COMPENSATING CIRCUIT

(75) Inventor: Motoya Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 755 days.

(21) Appl. No.: 10/607,149

(22) Filed: Jun. 27, 2003

(65) Prior Publication Data

US 2004/0047432 A1    Mar. 11, 2004

(30) Foreign Application Priority Data

Jun. 28, 2002   (JP) ............... 2002-189489

(51) Int. Cl.
*H04K 1/02*    (2006.01)

(52) U.S. Cl. .................. 375/297
(58) Field of Classification Search ......... 375/295–297
See application file for complete search history.

(56) References Cited

U.S. PATENT DOCUMENTS

| | | | | |
|---|---|---|---|---|
| 5,105,445 A | * | 4/1992 | Karam et al. ............... | 375/296 |
| 6,731,168 B2 | * | 5/2004 | Hedberg et al. ............ | 330/149 |

FOREIGN PATENT DOCUMENTS

| | | |
|---|---|---|
| JP | 9-69733 | 3/1997 |
| JP | 9-289593 | 11/1997 |
| JP | 2000-31869 | 1/2000 |
| JP | 2001-268149 | 9/2001 |
| JP | 2001-268150 | 9/2001 |
| JP | 2002-094798 | 3/2002 |
| JP | 2002-135349 | 5/2002 |
| WO | WO 00/01065 A | 1/2000 |

OTHER PUBLICATIONS

International Search Report dated Apr. 20, 2007.
Levy Y. et al.: "Adaptation of a Digital Predistortion Technique Based on Intersymbol Interpolation"; Global Telecommunications Conference 1995. Conference Record. Communication Theory Mini-Conference, Globecom '95, IEEE Singapore Nov. 13-17, 1995, New York, NY, USA, IEEE, US vol. 1, Nov. 13, 1995, pp. 145-150, XP010607544 ISBN: 0-7803-2509-5.

* cited by examiner

*Primary Examiner*—Kevin Burd
(74) *Attorney, Agent, or Firm*—McGinn IP Law Group, PLLC

(57) ABSTRACT

A nonlinear distortion compensating circuit in which a digital value expressing the amplitude of an input signal is divided into upper and lower bits. Only the upper bits are input to a first memory address. A value obtained by adding 1 to the upper bits is input to a second memory address, or, an interpolation circuit to which the upper bits are input, inputs the upper bits to a first memory storing data corresponding to an even numbered address and a second memory storing data corresponding to an odd numbered address, and performs interpolation by adding outputs from the memories by weighting these outputs in accordance with a value expressed by the lower bits. The input signal is multiplied by the obtained value. An interpolation circuit output is an orthogonal coordinate expression (combination of a real part and imaginary part) or polar coordinate expression (combination of an amplitude and phase).

12 Claims, 5 Drawing Sheets

NONLINEAR DISTORTION COMPENSATING CIRCUIT

BACKGROUND OF THE INVENTION

1. Field of the Invention

The present invention relates to a predistortion type nonlinear distortion compensating circuit (predistorter) which compensates for nonlinear distortion by multiplying an input signal by the inverse characteristic of the nonlinear characteristic of an AMP in, e.g., a baseband unit of a transmitter used in a CDMA communication system or the like.

2. Description of the Prior Art

In recent digital mobile communication, a CDMA communication system is beginning to be used in many cases in order to increase the anti-interference capability. In this CDMA communication system, the instantaneous power is higher than the mean power. Therefore, to reduce the adjacent-channel leakage power, it is necessary to hold the linearity of a high-output power amplifier on the transmitting side up to a very high output level. Since this increases the size of the output amplifier, the amplifier becomes expensive and consumes high power. To implement a high-efficiency, low-distortion transmitting unit, therefore, a predistortion technique is extensively studied to make a nonlinear output amplifier usable by applying the nonlinear inverse characteristic in a baseband unit before the transmitting unit. This technique is excellent in stability and space saving properties because distortion can be compensated by digital signal processing in the baseband unit.

Techniques pertaining to this predistortion technique are also disclosed in, e.g., Japanese Unexamined Patent Publication No. 2000-31869 (a transmitting apparatus and method having a predistortion compensating function), Japanese Unexamined Patent Publication No. 2001-268149 (an adaptive predistortion compensating apparatus and adaptive predistortion compensating method), and Japanese Unexamined Patent Publication No. 2001-268150 (a linearizer).

In a transmitting apparatus including a nonlinear distortion compensating circuit of this type, the nonlinear inverse characteristic is added to an input signal by a predistorter. After that, the input signal is quadrature-modulated, amplified by an AMP, and output. Generally, the nonlinear characteristic of the AMP is estimated by comparing an input to the predistorter with a signal obtained by quadrature-modulating the AMP output, and the inverse characteristic of this nonlinear characteristic is set in a memory of the predistorter.

FIG. 1 is a block diagram showing the arrangement of the main parts of a transmitting apparatus including a conventional example of a nonlinear distortion compensating circuit (predistorter) 200 as the core of the predistortion technique.

A transmitting apparatus 100 shown in FIG. 1 includes a nonlinear distortion compensating circuit main unit 300, two D/A (Digital/Analog) converters 101a and 101b, local oscillator 102, quadrature modulator 103, power amplifier 104, antenna 105, and the like. The nonlinear distortion compensating circuit main unit 300 includes, e.g., two input terminals, i.e., Ti (I component input terminal) and Tq (Q component input terminal), for a transmission IQ signal (in which an in-phase component and quadrature component are expressed by complex numbers), a complex multiplier 10, an amplitude converter 20, and a memory 40. The D/A converters 101a and 101b convert digital signals Si and Sq to be transmitted, which are output from the nonlinear distortion compensating circuit main unit 300, into analog signals. The quadrature modulator 103 quadrature-modulates the outputs from the two D/A converters by using an oscillation signal from the local oscillator. The power amplifier 104 amplifies the power of the output from the quadrature modulator 103. The antenna 105 transmits the output from the power amplifier 104 as an electric wave.

A coupler 201 for extracting the output from the power amplifier 104 is inserted between the power amplifier 104 and the antenna 105. An attenuator 202, a quadrature demodulator 203, and a pair of A/D (Analog/Digital) converters 204a and 204b are connected in series with the coupled output from the coupler 201 to form a feedback loop of the output signal from the power amplifier 104. The outputs from the two A/D converters are input to a memory correction arithmetic unit 30. The output from the memory correction arithmetic unit 30 is connected to the memory 40 of the nonlinear distortion compensating circuit main unit.

The memory correction arithmetic unit 30 includes a distortion compensation value calculator 31. On the basis of an input signal (transmission IQ signal) to the transmitting apparatus 100 and a distortion compensation value corresponding to the amplitudes and phases of the outputs (feedback signals) from the A/D converters 204a and 204b, the distortion compensation value calculator 31 calculates an updated value of the distortion compensation value to be stored in the memory 40.

The nonlinear distortion compensating circuit main unit 300 comprises the complex multiplier 10 inserted between the terminals Ti and Tq and the two D/A converters 101a and 101b, the amplitude converter 20 for calculating an amplitude X of input signals from the input terminals Ti and Tq, and the memory 40 which stores a distortion compensation value corresponding to the amplitude X and supplies this distortion compensation value to the complex multiplier 10. The memory 40 includes an address generator 41 and compensation data table (memory) 42. These components are controlled by a distortion compensation controller (not shown). The nonlinear distortion compensating circuit main unit 300 is formed by, e.g., a well-known microcomputer circuit which includes a ROM (not shown) storing programs and the like and a RAM (not shown).

In the memory 40, the compensation data table 42 storing compensation values each related to the amplitude X of a predicted input value so as to be used in distortion compensation is stored on a programmable memory. Assume that the amplitude X of an input signal is expressed by normalization so as not to exceed a maximum of 1. In the compensation data table 42, a plurality of compensation data by which the inverse characteristic of a predetermined nonlinear characteristic of the power amplifier 104 is expressed by complex numbers with respect to input amplitudes are set as initial values. Alternatively, it is also possible to unconditionally set each compensation data like, e.g., Si=1 and Sq=0, and gradually cause the data table to learn.

A nonlinear distortion compensating operation by this transmitting apparatus will be explained below. In the nonlinear distortion compensating circuit main unit, the amplitude converter 20 calculates the amplitude (the absolute value of a complex number) of a transmission IQ signal (in which an in-phase component and quadrature component are expressed by complex numbers) input from a signal source in the input stage to the input terminals Ti and Tq, and outputs the calculated amplitude to the memory 40. The address generator 41 of the memory 40 outputs a corresponding address in the compensation data table 42. The compensation data table 42 stores compensation data by which the inverse characteristic of the nonlinear characteristic of the amplifier is expressed by complex numbers with respect to input amplitudes. Compensation data (the nonlinear inverse characteristic) in the designated address is output from the memory 40 to the complex multiplier 10.

The complex multiplier 10 multiplies the transmission IQ signal by the compensation data output in a complex form, thereby adding the nonlinear inverse characteristic to the input transmission IQ signal. This distortion-compensated signal is output to the power amplifier 104 via the D/A converters 101a and 101b and quadrature modulator 103. The output from the power amplifier 104 is output from the antenna 105 via the coupler 201.

At the same time, the transmission signal detected and extracted by the coupler 201 connected to the output of the power amplifier 104 is fed back, as is well known, through the feedback loop made up of the attenuator 202, quadrature modulator 203, and D/A converters 204a and 204b. That is, a portion of the transmission signal is detected by the coupler 201 and attenuated by the attenuator 202. The quadrature modulator 203 detects an IQ signal (to be referred to as a detected IQ signal hereinafter), and this signal is converted into a digital signal by the A/D converters 204a and 204b. The digital signal is input to the memory correction arithmetic unit 30. The distortion compensation value calculator 31 detects an error between this digital signal and the transmission IQ signal, and the corresponding distortion compensation value in the compensation data table 42 of the memory 40 is updated.

That is, the memory correction arithmetic unit 30 replaces the distortion compensation value of a record with the updated distortion compensation value obtained from the memory correction arithmetic unit 30. An appropriate operation can be performed by thus updating the distortion compensation data table 42 as needed. Note that a certain time is necessary before the distortion compensation data table 31 is set to an appropriate value after the operation is started.

When the result of conversion of an input signal by the amplitude converter is to be output as N-bit digital data in the above system, a capacity of 2N words is necessary as the capacity of the distortion compensation data table (memory) 42 for storing the nonlinear inverse characteristic. Since the memory capacity has a large effect on the circuit scale, it is important to reduce the memory capacity.

SUMMARY OF THE INVENTION

It is an object of the present invention to solve the above problem, propose a predistortion technique capable of decreasing a circuit scale by reducing a memory capacity pertaining to a nonlinear distortion compensating operation, and provide a nonlinear distortion compensating circuit having a small circuit scale.

To achieve the above object, according to a first aspect of the present invention, there is provided a predistortion type nonlinear distortion compensating circuit which is placed before a power amplifier having a distortion characteristic, and outputs to the power amplifier a compensation signal obtained by distorting an input signal by a distortion compensation value corresponding to an amplitude of the input signal. The predistortion type nonlinear distortion compensating circuit includes an amplitude converter for calculating an amplitude value of an input signal, converting the calculated amplitude value into N bit digital data, and outputting M upper bits and L remaining lower bits of the N bit digital data, a complex multiplier for executing a complex arithmetic operation by receiving the input signal as one input and interpolation data as the other input, and outputting the result to the power amplifier, a first memory which stores a nonlinear inverse characteristic of the power amplifier, receives output data having the M upper bits, and outputs a first corresponding value having a value of the M upper bits as an address, and a second memory which stores the same nonlinear inverse characteristic of the power amplifier, receives a value obtained by adding 1 to the M upper bit output data, and outputs a second corresponding value having a value of the M upper bits+1 as an address. The predistortion type nonlinear distortion compensating circuit includes an interpolation circuit for receiving outputs from the first and second memories and output data having the L lower bits, and, on the basis of the inputs, outputting interpolation data corresponding to the input signal to the complex multiplier.

According to a second aspect of the present invention, there is provided a nonlinear distortion compensating circuit, wherein letting $X_1+jY_1$ be a corresponding output of the first memory, $X_2+jY_2$ be a corresponding output of the second memory, and $A_L$ be an L-lower-bit output of the amplitude value, the interpolation circuit according to the first aspect performs an arithmetic operation indicated by $$X+jY=(X_1+jY_1)*(1-A_L/2^L)+(X_2+jY_2)*A_L/2^L$$

and outputs a value (X,Y).

To achieve the above object, according to a third aspect of the present invention, there is provided a predistortion type nonlinear distortion compensating circuit which is placed before a power amplifier having a distortion characteristic, and outputs to the power amplifier a compensation signal obtained by distorting an input signal by a distortion compensation value corresponding to an amplitude of the input signal. The predistortion type nonlinear distortion compensating circuit includes an amplitude converter for calculating an amplitude value of an input signal, converting the calculated amplitude value into N bit digital data, and outputting M upper bits and L remaining lower bits of the N bit digital data, two multipliers each for receiving one of a pair input signals as one input, a complex multiplier for executing a complex arithmetic operation by receiving outputs from the two multipliers as one input and interpolation data as the other input, and outputting the result to the power amplifier, a first memory which stores a nonlinear inverse characteristic of the power amplifier, receives output data having the M upper bits, and outputs a first corresponding value having a value of the M upper bits as an address, and a second memory which stores the same nonlinear inverse characteristic of the power amplifier, receives a value obtained by adding 1 to the M upper bit output data, and outputs a second corresponding value having a value of the M upper bits+1 as an address. The predistortion type nonlinear distortion compensating circuit includes an interpolation circuit for receiving outputs from the first and second memories and output data having the L lower bits, and, on the basis of the inputs, outputting to each of the multipliers an amplitude component of interpolation data corresponding to the input signal, and outputting a phase component of the interpolation data, and a cos converter and sin converter for converting the phase component output from the interpolation circuit and outputting as the other input to the complex multiplier.

According to a fourth aspect of the present invention, there is provided a nonlinear distortion compensating circuit, wherein letting $R_1$ and $\theta_1$ be an output of the first memory, $R_2$ and $\theta_2$ be an output of the second memory, and $A_L$ be an L-lower-bit output of the amplitude value, the interpolation circuit according to the third aspect performs an arithmetic operation indicated by $$R=R_1*(1-A_L/2^L)+R_2*A_L/2^L$$

$$\theta=\theta_1*(1-A_L/2^L)+\theta_2*A_L/2^L$$

and outputs a value (R, θ).

To achieve the above object, according to a fifth aspect of the present invention, there is provided a predistortion type nonlinear distortion compensating circuit which is placed before a power amplifier having a distortion characteristic, and outputs to the power amplifier a compensation signal obtained by distorting an input signal by a distortion compensation value corresponding to an amplitude of the input signal, comprising an amplitude converter for calculating an amplitude value of an input signal, converting the calculated amplitude value into N-bit digital data, and outputting M upper bits and L remaining lower bits of the N-bit digital data, a complex multiplier for executing a complex arithmetic operation by receiving the input signal as one input and interpolation data as the other input, and outputting the result to the power amplifier, a selecting circuit for receiving output data having the M upper bits from the amplitude converter and data obtained by adding 1 to the M-upper-bit output data, and selectively outputting M−1 upper bits of the M upper bits in accordance with whether a value of the M upper bits is an even number or odd number, a first memory which stores a nonlinear inverse characteristic of the power amplifier, and, if the M-upper-bit data is an even number, outputs a first corresponding value having a value of the M−1 upper bits input from the amplitude converter as an address, a second memory which stores the same nonlinear inverse characteristic of the power amplifier, and, if the M-upper-bit data is an odd number, outputs a second corresponding value having a value of the M−1 upper bits input from the amplitude converter as an address, and an interpolation circuit for receiving outputs from the first and second memories, output data having the L lower bits, and a least significant bit of the M upper bits, and, on the basis of the inputs, outputting interpolation data corresponding to the input signal to the complex multiplier.

According to a sixth aspect of the present invention, there is provided a nonlinear distortion compensating circuit, wherein letting $X_1+jY_1$ be a corresponding output of the first memory, $X_2+jY_2$ be a corresponding output of the second memory, and $A_L$ be an L-lower-bit output of the amplitude value, (a) if the least significant bit of the M upper bits is 0, the interpolation circuit according to the fifth aspect performs an arithmetic operation indicated by $$X+jY=(X_1+jY_1)*(1-A_L/2^L)+(X_2+jY_2)*A_L/2^L$$

and outputs a value (X,Y), and, (b) if the least significant bit of the M upper bits is 1, the interpolation circuit performs an arithmetic operation indicated by $$X+jY=(X_2+jY_2)*(1-A_L/2^L)+(X_1+jY_1)*A_L/2^L$$

and outputs a value (X,Y).

To achieve the above object, according to a seventh aspect of the present invention, there is provided a predistortion type nonlinear distortion compensating circuit which is placed before a power amplifier having a distortion characteristic, and outputs to the power amplifier a compensation signal obtained by distorting an input signal by a distortion compensation value corresponding to an amplitude of the input signal, comprising an amplitude converter for calculating an amplitude value of an input signal, converting the calculated amplitude value into N-bit digital data, and outputting M upper bits and L remaining lower bits of the N-bit digital data, two multipliers each for receiving one of a pair input signals as one input, a complex multiplier for executing a complex arithmetic operation by receiving outputs from the two multipliers as one input and interpolation data as the other input, and outputting the result to the power amplifier, a selecting circuit for receiving output data having the M upper bits from the amplitude converter and data obtained by adding 1 to the M-upper-bit output data, and selectively outputting M−1 upper bits of the M upper bits in accordance with whether a value of the M upper bits is an even number or odd number, a first memory which stores a nonlinear inverse characteristic of the power amplifier, and, if the M-upper-bit data is an even number, outputs a first corresponding value having a value of the M−1 upper bits input from the amplitude converter as an address, a second memory which stores the same nonlinear inverse characteristic of the power amplifier, and, if the M-upper-bit data is an odd number, outputs a second corresponding value having a value of the M−1 upper bits input from the amplitude converter as an address, an interpolation circuit for receiving outputs from the first and second memories, output data having the L lower bits, and a least significant bit of the M upper bits, and, on the basis of the inputs, outputting to each of the multipliers an amplitude component of interpolation data corresponding to the input signal, and outputting a phase component of the interpolation data, and a cos converter and sin converter for converting the phase component output from the interpolation circuit and outputting as the other input to the complex multiplier.

According to an eighth aspect of the present invention, there is provided a nonlinear distortion compensating circuit, wherein letting $R_1$ and $\theta_1$ be an output of the first memory, $R_2$ and $\theta_2$ be an output of the second memory, and $A_L$ be an L-lower-bit output of the amplitude value, (a) if the least significant bit of the M upper bits is 0, the interpolation circuit according to the seventh aspect performs an arithmetic operation indicated by $$R=R_1*(1-A_L/2^L)+R_2*A_L/2^L$$

$$\theta=\theta_1*(1-A_L/2^L)+\theta_2*A_L/2^L$$

and outputs a value (R, θ), and, (b) if the least significant bit of the M upper bits is 1, the interpolation circuit performs an arithmetic operation indicated by $$R=R_2*(1-A_L/2^L)+R_1*A_L/2^L$$

$$\theta=\theta_2*(1-A_L/2^L)+\theta_1*A_L/2^L$$

and outputs a value (R, θ).

To achieve the above object, according to a ninth aspect of the present invention, there is provided a nonlinear distortion compensating circuit according to any of the first to eighth aspects, further comprising feedback means for extracting a signal for feedback from an output from the power amplifier, and outputting the extracted signal as a feedback signal of the same type as the input signal, calculating means for calculating a new distortion compensation value on the basis of the feedback signal, the input signal, and a nonlinear inverse characteristic distortion compensation value used in distortion compensation of the input signal, and updating means for updating a corresponding distortion compensation value of the nonlinear inverse characteristic by the calculated new distortion compensation value.

In the nonlinear distortion compensating circuits according to the first to fourth aspects, a digital value expressing the amplitude of an input signal is divided into upper and lower bits, only the upper bits are input to an address in the first memory, and a value obtained by adding 1 to the upper bits is input to a second memory. Outputs from the first and second memories are interpolated by adding up these outputs after weighting them by a value expressed by the lower bits. The input signal is multiplied by the obtained value. Accordingly, an input signal which requires 2N words to express the amplitude is divided into M upper bits and L lower bits, so nonlinear distortion compensation can be performed by a memory capacity of $2*2L=2N-M+1$ words.

Also, in the nonlinear distortion compensating circuits according to the fifth to eighth aspects, data corresponding to even-numbered addresses of upper addresses is stored in the first memory, and data corresponding to odd-numbered addresses of the upper addresses is stored in the second memory. Interpolation is performed by reflecting a value expressed by the remaining lower bis, and an input signal is multiplied by the obtained value. Consequently, nonlinear distortion compensation can be performed by a memory capacity smaller than that in the first to fourth aspects.

Furthermore, the nonlinear distortion compensating circuit according to the ninth aspect further comprises feedback means for extracting a signal for feedback from an output from the power amplifier, and outputting the extracted signal as a feedback signal of the same type as the input signal, calculating means for calculating a new distortion compensation value on the basis of the feedback signal, the input signal, and a nonlinear inverse characteristic distortion compensation value used in distortion compensation of the input signal, and updating means for updating a corresponding distortion compensation value of the nonlinear inverse characteristic by the calculated new distortion compensation value. Since the distortion compensation value is updated as needed, a more appropriate operation is possible.

As is apparent from the above aspects, although $2^N$ words are necessary as the capacity of a memory for storing the nonlinear inverse characteristic of an output-stage amplifier in the conventional system, this memory capacity is $2*2^L=2^{N-M+1}$ words when the system of the present invention is used. That is, the memory capacity can be reduced to $\frac{1}{2}^{M-1}$. In addition, the memory capacity can be further reduced by half by another invention.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

First, the characteristic features of a nonlinear distortion compensating circuit of the present invention will be described below.

Similar to the prior art, in the nonlinear distortion compensating circuit (predistorter) according to the present invention, the amplitude (the absolute value of a complex number) of an input signal is input to an address in a memory, and the amplifier's nonlinear characteristic stored in the memory is output as a compensation value. In the present invention, a digital value expressing the amplitude of an input signal is divided into upper and lower bits. Only the upper bits are input to an address in a first memory, and a value obtained by adding 1 to the upper bits is input to an address in a second memory. Interpolation is performed by weighting the outputs from the first and second memories in accordance with a value expressed by the lower bits, and adding up the weighted outputs. The input signal is multiplied by the obtained value.

Alternatively, a digital value expressing the amplitude of an input signal is divided into upper and lower bits, and an interpolating circuit which has received the upper bits inputs the upper bits to an address in a first memory storing data corresponding to even-numbered addresses and an address in a second memory storing data corresponding to odd-numbered addresses. Interpolation is performed by weighting the outputs from the first and second memories in accordance with a value expressed by the lower bits, and adding up the weighted outputs. The input signal is multiplied by the obtained value.

In each of the above arrangements, an interpolating circuit output based on the outputs from the first and second memories can be an orthogonal coordinate expression (a combination of a real part and imaginary part), or a polar coordinate expression (a combination of an amplitude and phase).

Several preferred embodiments of the present invention will be described below with reference to the accompanying drawings.

First Embodiment

Figure 1:
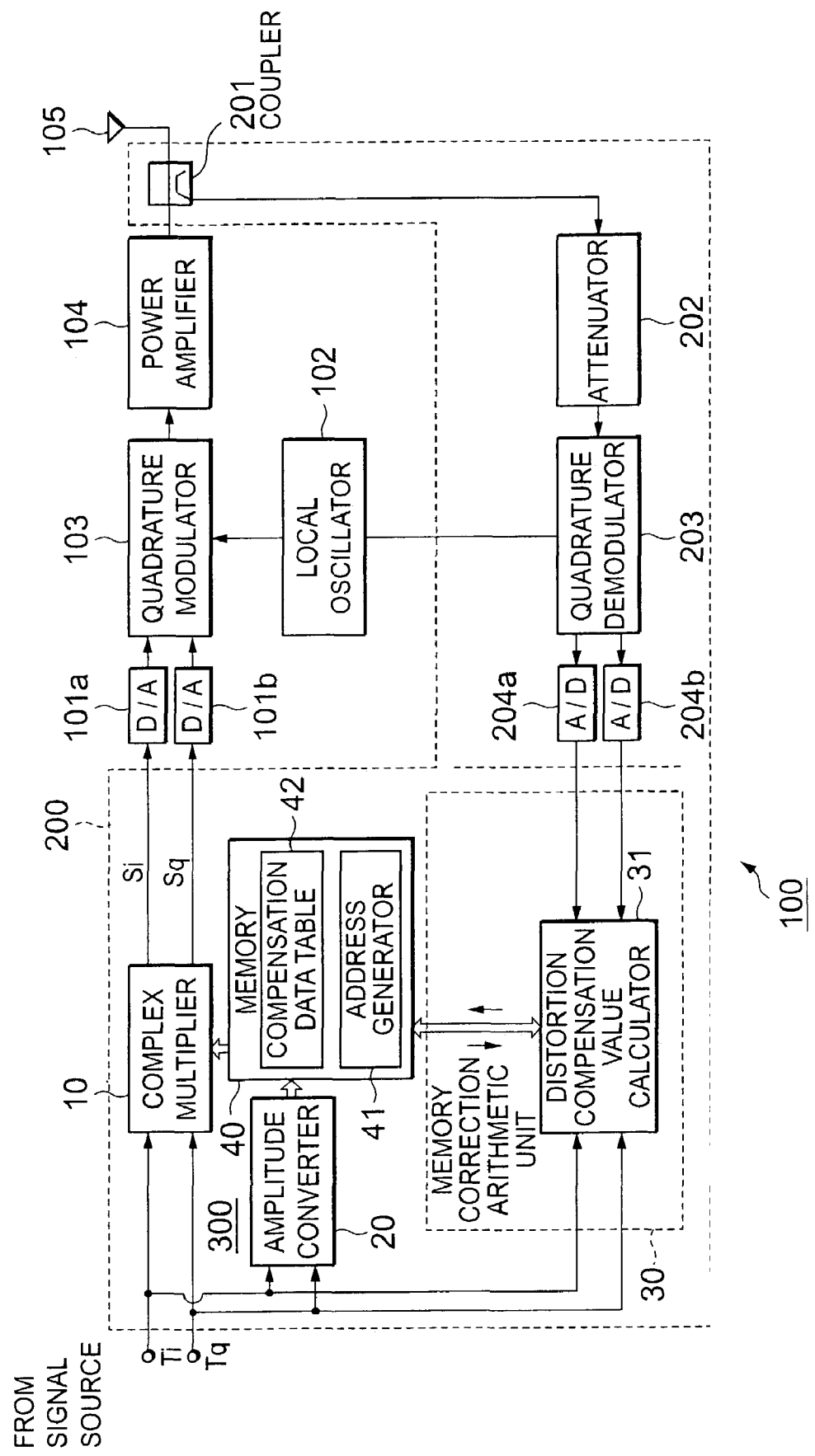
FIG. 1 is a block diagram showing the arrangement of a transmitting apparatus including a conventional nonlinear distortion compensating circuit.
Figure 2A:
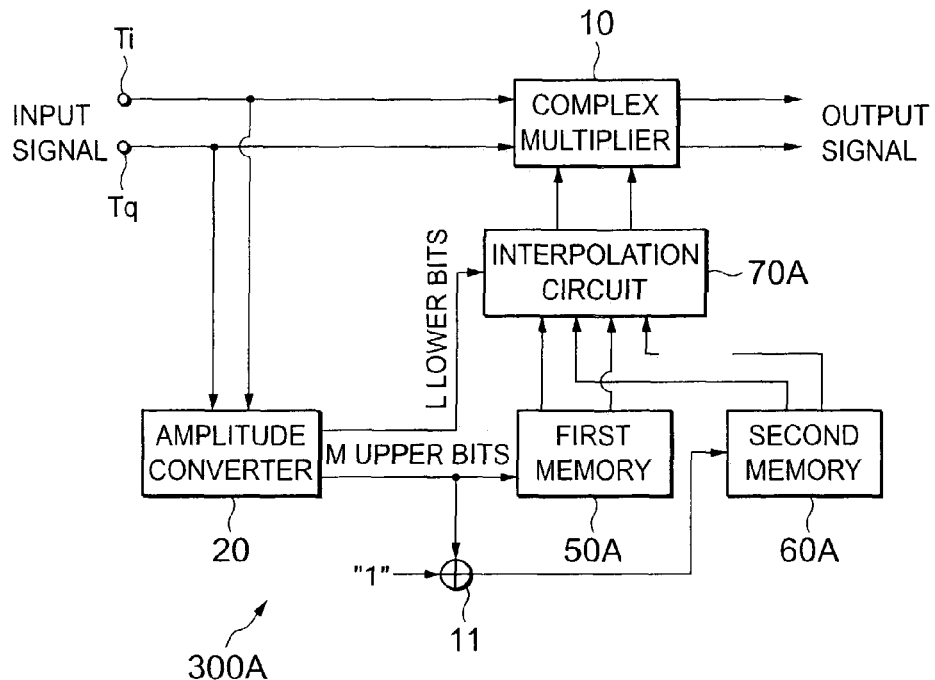
FIG. 2A is a block diagram showing the main parts of the first embodiment of a nonlinear distortion compensating circuit according to the present invention.
Figure 2B:
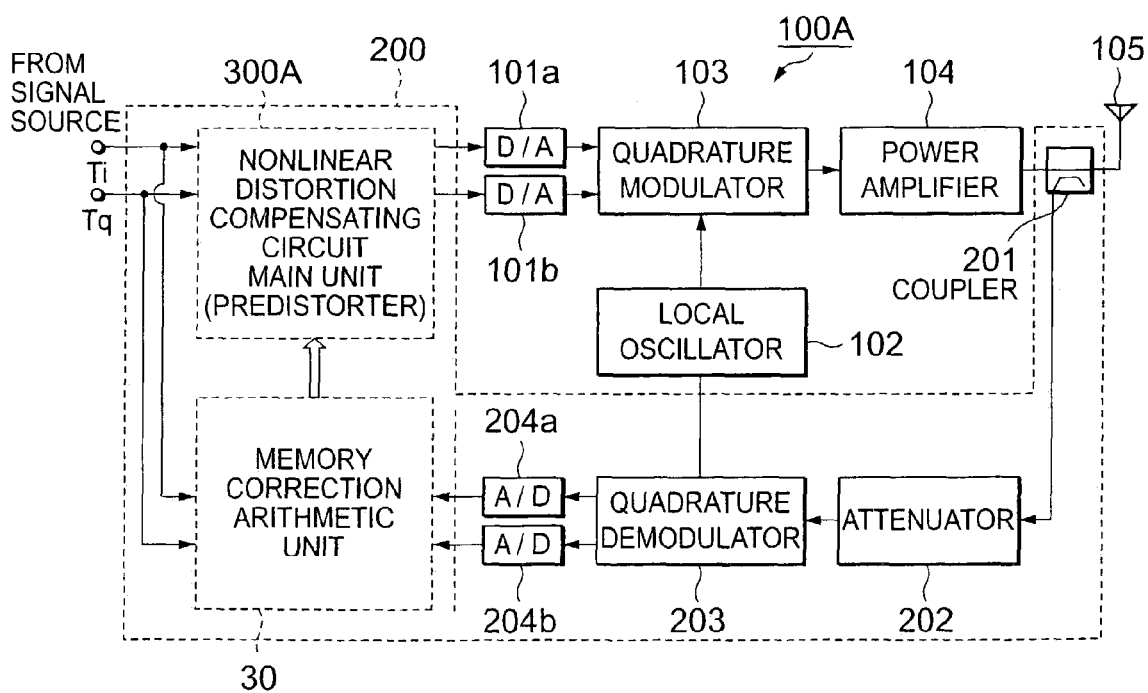
FIG. 2B is a block diagram showing the arrangement of a transmitting apparatus incorporating the nonlinear distortion compensating circuit according to the first embodiment of the present invention.

FIG. 2A is a block diagram showing the main parts of the first embodiment of a nonlinear distortion compensating circuit according to the present invention. This portion shown in FIG. 2A is incorporated as a nonlinear distortion compensating circuit main unit (predistorter) 300A in a transmitting apparatus 100A similar to the transmitting apparatus shown in FIG. 1 described earlier. In FIG. 2B, the same reference numerals as in FIG. 1 denote equivalent parts. An explanation of the same portions as the transmitting apparatus shown in FIG. 1 and the operations of these portions will be omitted.

As shown in FIG. 2A, the nonlinear distortion compensating circuit main unit 300A of the first embodiment comprises a complex multiplier 10 and amplitude converter 20 connected to input terminal Ti and Tq to receive input signals, a first memory 50A connected to the first output of the amplitude converter 20, a second memory 60A connected to the same first output via an adder 11, and an interpolation circuit 70A connected to the second output of the amplitude converter 10. The output of the first memory 50A and the output of the second memory 60A are connected to the interpolation circuit 70A. An output from the interpolation circuit 70A is input to the complex multiplier 10.

The amplitude converter 20 calculates the amplitude of an input signal, and converts the calculated value into N-bit digital data. In addition, the amplitude converter 20 outputs M upper bits of this N-bit digital data to the first memory 50A and to the second memory 60A via the adder 11 which adds "1", and outputs L remaining lower bits of the N bits to the interpolation circuit 70A.

The first memory 50A stores the nonlinear inverse characteristics of a power amplifier 104 (i.e., those inverse characteristics of the amplifier in the output stage, which correspond to N-bit amplitudes corresponding to all values represented by the M upper bits when all the L lower bits are "0"). When output data having the M upper bits is input, the first memory 50A outputs a first corresponding value having the value of the M upper bits as an address. The second memory 60A also stores the nonlinear inverse characteristics of the power amplifier 104. When the M-upper-bit output data to which 1 is added is input, the second memory 60A outputs a second corresponding value having the value of M upper bits+1 as an address.

The interpolation circuit 70A receives the outputs from the first and second memories and output data having the L lower bits. On the basis of these inputs, the interpolation circuit 70A outputs interpolation data corresponding to the amplitude of the input signal to the complex multiplier 10. The complex multiplier 10 executes complex multiplication by using the input signal as one input and the interpolation data from the interpolation circuit 70A as the other input.

In the first embodiment having the above arrangement, the input signal is converted into an amplitude value, separated into upper and lower bits, and then output by the amplitude converter 20. The upper-bit output is divided into two outputs. One output is directly input to an address in the first memory 50A, and the other output is input to an address in the second memory 60A after 1 is added to the output. Each of the outputs from the first and second memories to the interpolation circuit 70A is a complex number (orthogonal coordinate expression) made up of a real part and imaginary part. These outputs are added up after being weighted by the lower bits of the amplitude by the interpolation circuit 70A. Finally, the complex multiplier 10 multiplies the input signal by the output from the interpolation circuit 70A in a complex form. The result is output as an output signal of the nonlinear distortion compensating circuit.

The operation of the above first embodiment will be described in detail below.

Assuming that an input to the amplitude converter 20 is represented by P+jQ, an amplitude A is represented by $A=(P^2+Q^2)^{1/2}$. The amplitude converter 20 expresses this amplitude A by N bits, separates the N bits into M upper bits and L (N−M) lower bits, and outputs the M upper bits and L lower bits as $A_U$ and $A_L$, respectively, so that equation (1) below holds $$A=2^L*A_U+A_L \quad (1)$$

The first memory 50A and second memory 60A store the same nonlinear inverse characteristics of the power amplifier 104 as compensation data tables. The M upper bits $A_U$ are input to designate an address in the first memory 50A, and the M upper bits $A_U$+1 are input to designate an address in the second memory 60A. Assuming that the corresponding output of the first memory is $X_1+jY_1$ and the corresponding output of the second memory is $X_2+jY_2$, the interpolation circuit 70A performs an arithmetic operation indicated by $$X+jY=(X_1+jY_1)*(1-A_L/2L)+(X_2+jY_2)*A_L/2^L \quad (2)$$

by using these corresponding outputs and the lower-bit output $A_L$ of the amplitude, and outputs the interpolated value. This is equivalent to connecting the first memory output and second memory output by a straight line, and interpolating these outputs by weighting them in proportion to the lower bits.

The complex multiplier 10 multiplies the input signal by the interpolation circuit output in a complex form as indicated by $$P'+jQ'=(P+jQ)*(X+jY)=(PX-QY)+j(PY+QX) \quad (3)$$

and outputs P'+jQ'.

The conventional system described previously requires $2^N$ words as the capacity of a memory. However, the first embodiment can reduce the memory capacity to $2*2^L = 2^{N-M+1}$ words. That is, this system can effectively decrease the circuit scale by reducing the memory capacity to $\frac{1}{2}^{M-1}$.

Second Embodiment

Figure 3:
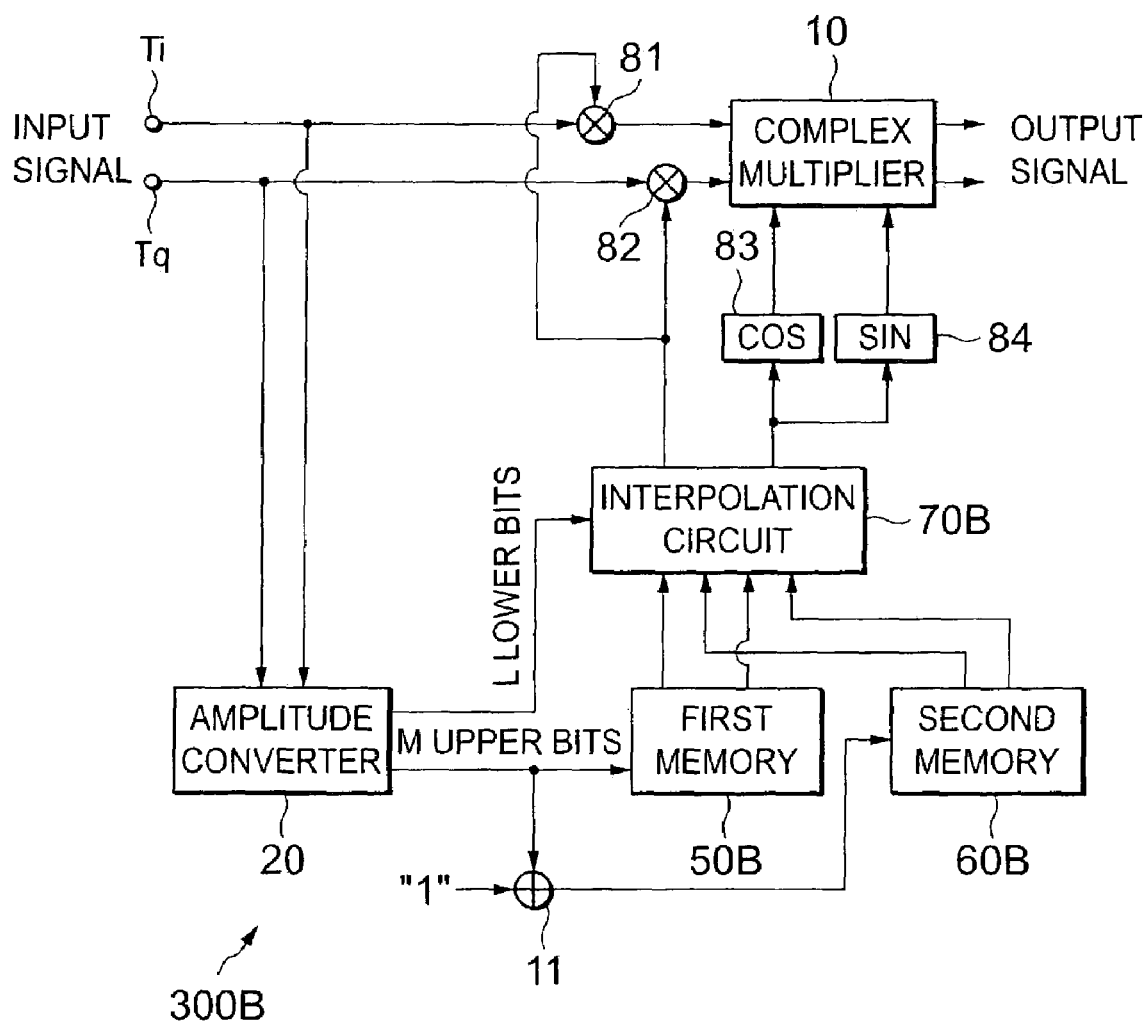
FIG. 3 is a block diagram showing a nonlinear distortion compensating circuit according to the second embodiment of the present invention.

The second embodiment of the nonlinear distortion compensating circuit is shown in a block diagram of FIG. 3. In FIG. 3, the same reference numerals as in FIG. 2A denote equivalent parts. In a nonlinear distortion compensating circuit 300B, the complex number expression of that output from an interpolation circuit, which is based on outputs from first and second memories, changes from an orthogonal coordinate expression (a combination of a real part and imaginary part) in the first embodiment to a polar coordinate expression (a combination of an amplitude and phase). The arrangement from first and second memories 50B and 60B to an interpolation circuit 70B is substantially the same as in the first embodiment, except for an arithmetic operating portion for an interpolation circuit output and input signal.

The second embodiment includes multipliers 81 and 82 inserted between input terminals Ti and Tq and a complex multiplier 10, and a cos converter 83 and sin converter 84 connected to the interpolation circuit 70B. The interpolation circuit 70B outputs a phase signal to the cos converter 83 and sin converter 84. The converted signals are input to the complex multiplier 10.

In the second embodiment, the interpolation circuit 70B first calculates an interpolation output. The multipliers 81 and 82 multiply a real part signal and imaginary part signal of an input signal by the amplitude output from the interpolation circuit 70B. Also, the cos converter 83 and sin converter 84 convert the phase output from the interpolation circuit 70B into cos and sin, respectively, thereby expressing a complex number. The complex multiplier 10 multiplies this interpolation circuit output by the multiplier outputs in a complex form.

Letting $R_1$ and $\theta_1$ denote an output from the first memory 50B and $R_2$ and $\theta_2$ denote an output from the second memory 60B, the interpolation circuit 70B performs arithmetic operations indicated by $$R = R_1 * (1 - A_L/2^L) + R_2 * A_L/2^L \quad (4)$$

$$\theta = \theta_1 * (1 - A_L/2^L) + \theta_2 * A_L/2^L \quad (5)$$

by using lower bits $A_L$ of the amplitude value, and outputs the interpolated value.

The multipliers 81 and 82 and complex multiplier 10 perform an arithmetic operation for the input signal and interpolation circuit output in accordance with $$P' + jQ' = (P + jQ) * R * (\cos\theta + j\sin\theta) = R[(P\cos\theta - Q\sin\theta) + j(P\sin\theta + Q\cos\theta)] \quad (6)$$

and outputs $P' + jQ'$.

In the second embodiment, a necessary memory capacity is $2 * 2^L = 2^{N-M+1}$ words. As in the first embodiment, therefore, the memory capacity can be reduced to $\frac{1}{2}^{M-1}$, so the circuit scale can be decreased.

Third Embodiment

Figure 4:
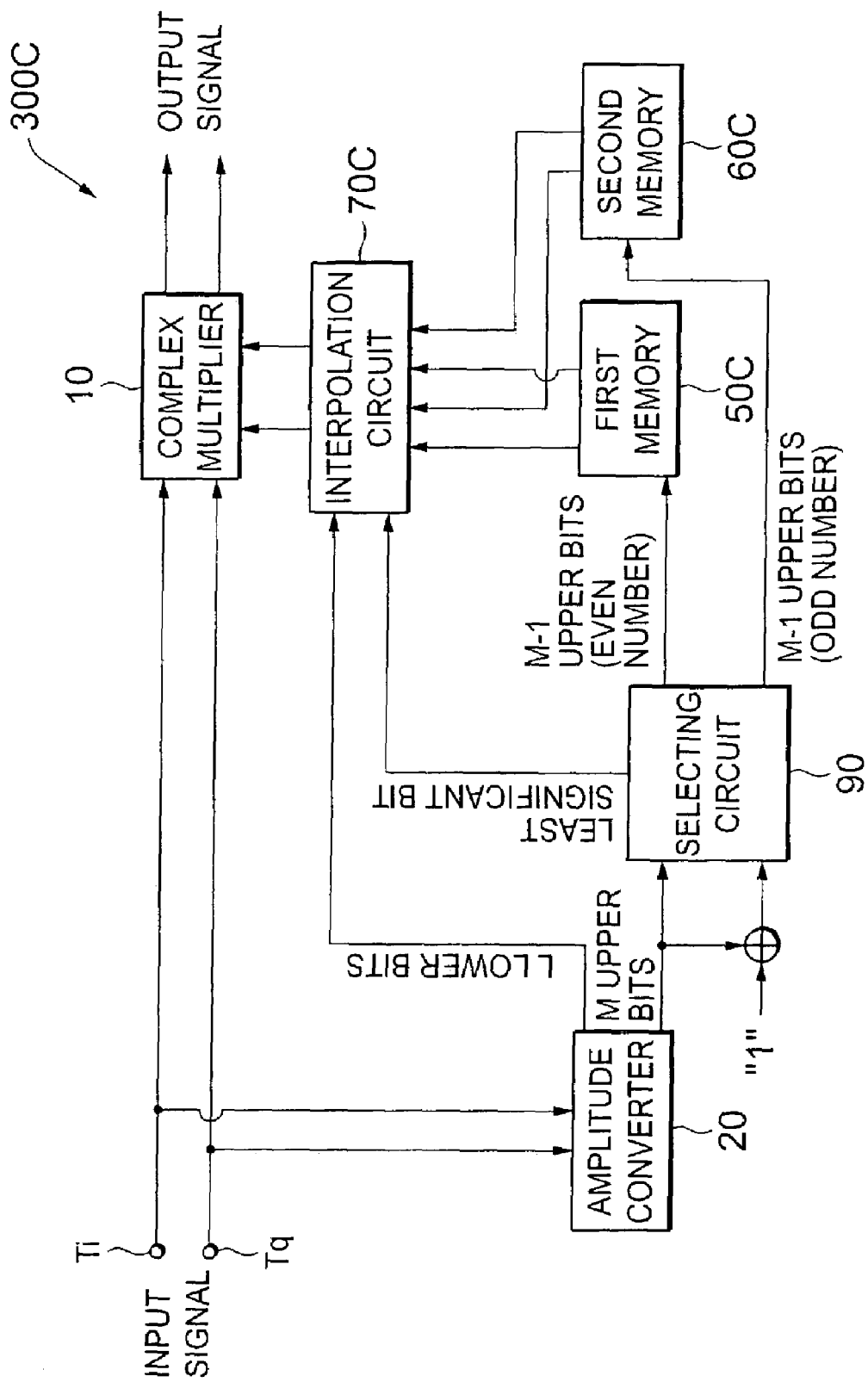
FIG. 4 is a block diagram showing a nonlinear distortion compensating circuit according to the third embodiment of the present invention.

FIG. 4 is a block diagram showing the third embodiment of the nonlinear distortion compensating circuit. The third embodiment can further reduce the memory capacity to half that of the first embodiment. A nonlinear distortion compensating circuit 300C of this embodiment comprises a complex multiplier 10 and amplitude converter 20 equivalent to those of the circuit of the first embodiment, a first memory 50C, a second memory 60C, an interpolation circuit 70C, and a selecting circuit 90.

In the third embodiment, the first memory 50C stores data corresponding to even-numbered addresses of M address bits, and the second memory 60C stores data corresponding to odd-numbered addresses of the M address bits. That is, of output-stage amplifier inverse characteristics corresponding to N-bit amplitudes which correspond to all values represented by M upper bits $A_U$ when all L lower bits are 0, the first memory stores characteristics by which the values of the M upper bits $A_U$ are even numbers, and the second memory stores characteristics by which the values of the M upper bits are odd numbers.

The selecting circuit 90 receives the M upper bits $A_U$ output from the amplitude converter 20, and the value of $A_U + 1$. The selecting circuit 90 so selects the two input signals that M−1 upper bits representing an even number are output to the first memory, and M−1 upper bits representing an odd number are output to the second memory. Also, the selecting circuit 90 outputs the least significant bit of the M upper bits $A_U$ to the interpolation circuit.

The interpolation circuit 70C receives the outputs from the first and second memories 50C and 60C, the least significant bit of the M upper bits $A_U$ output from the selecting circuit 90, and output data having the L lower bits from the amplitude converter 20. The interpolation circuit 70C outputs interpolation data determined from these inputs to the complex multiplier 10.

In the third embodiment, the amplitude converter 20 converts an input signal into an amplitude value, and outputs this amplitude value after separating it into upper and lower bits. The upper-bit output is divided into two outputs. One output is directly input to the selecting circuit 90, and the other output is input to the selecting circuit 90 after 1 is added to the output. The lower bits are input to the interpolation circuit 70C.

The selecting circuit 90 outputs the least significant bit of the M upper bits $A_U$ to the interpolation circuit 70C. Also, the selecting circuit 90 outputs M−1 upper bits to the first or second memory 50C or 60C in accordance with whether the number represented by the M upper bits $A_U$ is an even number or odd number. The first or second memory 50C or 60C outputs data of the corresponding address to the interpolation circuit 70C.

If the least significant bit of the M upper bits $A_U$ is "0", the address in the first memory is smaller than that in the second memory. Therefore, the interpolation circuit 70C performs an interpolating operation in accordance with $$X + jY = (X_1 + jY_1) * (1 - A_L/2L) + (X_2 + jY_2) * A_L/2^L \quad (7)$$

where $X_1 + jY_1$ is the corresponding output from the first memory, $X_2 + jY_2$ is the corresponding output from the second memory, and $A_L$ is the L-lower-bit output. The interpolation circuit 70C outputs the interpolation data to the complex multiplier 10.

If the least significant bit of the M upper bits $A_U$ is "1", the address in the first memory is larger than that in the second memory. Therefore, the interpolation circuit 70C performs an interpolating operation in accordance with $$X + jY = (X_2 + jY_2) * (1 - A_L/2L) + (X_1 + jY_1) * A_L/2^L \quad (8)$$

and outputs the interpolation data to the complex multiplier 10.

By the above processing, the memory capacity of the nonlinear distortion compensating circuit of the third embodiment can be further reduced by half, although the result of the interpolating operation is exactly the same as in the first embodiment.

Fourth Embodiment

It is also possible to apply to the above third embodiment an arrangement, similar to that explained in the second embodiment, in which the complex number expression of an interpolation circuit output based on outputs from two, first and second memories is changed to a polar coordinate expression (a combination of an amplitude and phase). This configuration is shown in FIG. 5 as the fourth embodiment of the present invention.

Figure 5:
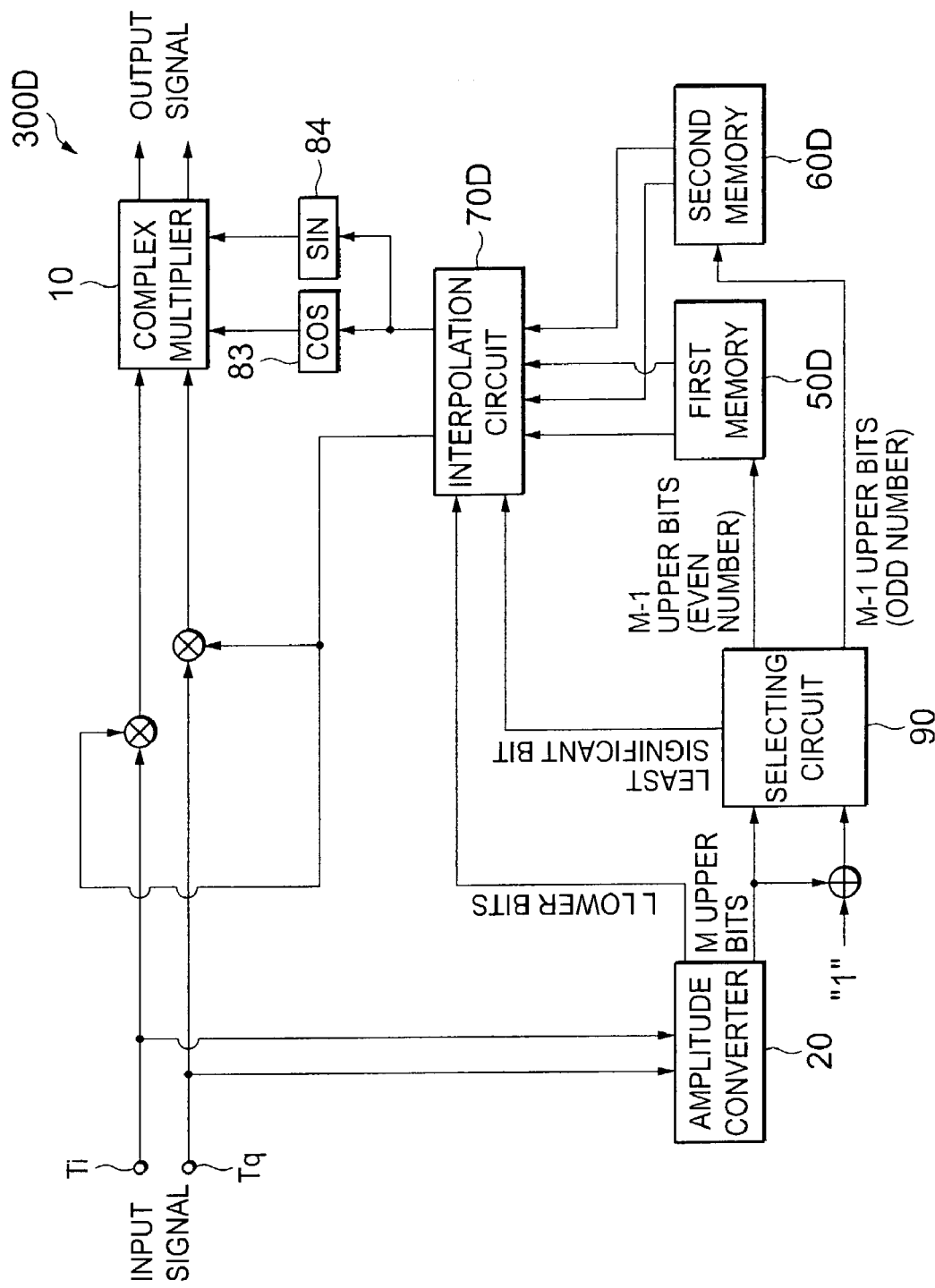
FIG. 5 is a block diagram showing a nonlinear distortion compensating circuit according to the fourth embodiment of the present invention.

As is evident from FIG. 5, the fourth embodiment has an arrangement obtained by combining the second embodiment shown in FIG. 3 and the third embodiment shown in FIG. 4. In other words, the fourth embodiment is a nonlinear distortion compensating circuit obtained by incorporating multipliers 81 and 82 into the third embodiment shown in FIG. 4.

In the fourth embodiment, if the least significant bit of M upper bits $A_U$ is "0", the address in the first memory is smaller than that in the second memory. Therefore, an interpolation circuit performs an interpolating operation in accordance with $$R = R_1 * (1 - A_L/2^L) + R_2 * A_L/2^L \quad (9)$$

$$\theta = \theta_1 * (1 - A_L/2^L) + \theta_2 * A_L/2^L \quad (10)$$

and outputs the interpolation data to a complex multiplier.

If the least significant bit of M upper bits $A_U$ is "1", the address in the first memory is larger than that in the second memory. Therefore, the interpolation circuit performs an interpolating operation in accordance with $$R=R_2*(1-A_L/2^L)+R_1*A_L/2^L \quad (11)$$

$$\theta=\theta_2*(1-A_L/2^L)+\theta_1*A_L/2^L \quad (12)$$

and outputs the interpolation data to the complex multiplier.

Although an explanation is omitted, each memory updates stored compensation values (a compensation data table) in the same manner as already described in each embodiment. That is, as shown in FIG. 2B, each embodiment includes a feedback means, equivalent to that shown in FIG. 1, which extracts a signal to be fed back from the output of the power amplifier 104 and outputs this signal as a feedback signal of the same type as the input signal, and also includes an appropriate memory correction arithmetic unit 30 which comprises a calculating means and updating means. The calculating means calculates a new distortion compensation value on the basis of the feedback signal, the input signal, and the nonlinear inverse characteristic distortion compensation value used in distortion compensation of the input signal. The updating means updates the corresponding distortion compensation value of the nonlinear inverse characteristic by the calculated new distortion compensation value. A proper nonlinear distortion compensating operation can be performed by updating the distortion compensation value as needed. The memory correction arithmetic unit 30 can be the circuit shown in FIG. 1 or another similar circuit. Note that this compensation value updating operation is not essential to the nonlinear distortion compensating circuit of the present invention.

Although the embodiments of the present invention have been explained above, the present invention is not limited to these embodiments and can be practiced as it is modified without departing from the spirit and scope of the invention. In each embodiment, a value of M upper bits+1 is generated by using the adder 11. However, the amplitude converter or the second memory may also have this function. Also, in each embodiment, the first and second memories are different memories. However, compensation data equivalent to the above explanation may also be placed on the same memory by using an appropriate memory management circuit.

What is claimed is:

1. A predistortion type nonlinear distortion compensating circuit which is placed before a power amplifier having a distortion characteristic, and outputs to said power amplifier a compensation signal obtained by distorting an input signal by a distortion compensation value corresponding to an amplitude of the input signal, comprising:
    an amplitude converter for calculating an amplitude value of an input signal, converting the calculated amplitude value into N bit digital data, and outputting M upper bits and L remaining lower bits of the N bit digital data;
    two multipliers each for receiving one of a pair input signals as one input;
    a complex multiplier for executing a complex arithmetic operation by receiving outputs from said two multipliers as one input and interpolation data as the other input, and outputting the result to said power amplifier;
    a first memory which stores a nonlinear inverse characteristic of said power amplifier, receives output data having the M upper bits, and outputs a first corresponding value having a value of the M upper bits as an address;
    a second memory which stores the same nonlinear inverse characteristic of said power amplifier, receives a value obtained by adding 1 to the M upper bit output data, and outputs a second corresponding value having a value of the M upper bits+1 as an address;
    an interpolation circuit for receiving outputs from said first and second memories and output data having the L lower bits, and, on the basis of the inputs, outputting to each of said two multipliers an amplitude component of interpolation data corresponding to the input signal, and outputting a phase component of the interpolation data; and
    a cos converter and sin converter for converting the phase component output from said interpolation circuit and outputting as the other input to said complex multiplier.

2. A circuit according to claim 1, wherein letting R1 and θ1 be an output of said first memory, R2 and θ2 be an output of said second memory, and AL be an L lower bit output of the amplitude value, said interpolation circuit performs an arithmetic operation indicated by $$R=R1*(1-AL/2L)+R2*AL/2L$$

$$\theta=\theta1(1-AL/2L)+\theta2*AL/2L$$

and outputs a value (R, θ).

3. A circuit according to claim 2, further comprising:
    feedback means for extracting a signal for feedback from an output from said power amplifier, and outputting the extracted signal as a feedback signal of the same type as the input signal;
    calculating means for calculating a new distortion compensation value on the basis of the feedback signal, the input signal, and a nonlinear inverse characteristic distortion compensation value used in distortion compensation of the input signal; and
    updating means for updating a corresponding distortion compensation value of the nonlinear inverse characteristic by the calculated new distortion compensation value.

4. A circuit according to claim 1, further comprising:
    feedback means for extracting a signal for feedback from an output from said power amplifier, and outputting the extracted signal as a feedback signal of the same type as the input signal;
    calculating means for calculating a new distortion compensation value on the basis of the feedback signal, the input signal, and a nonlinear inverse characteristic distortion compensation value used in distortion compensation of the input signal; and
    updating means for updating a corresponding distortion compensation value of the nonlinear inverse characteristic by the calculated new distortion compensation value.

5. A predistortion type nonlinear distortion compensating circuit which is placed before a power amplifier having a distortion characteristic, and outputs to said power amplifier a compensation signal obtained by distorting an input signal by a distortion compensation value corresponding to an amplitude of the input signal, comprising:
    an amplitude converter for calculating an amplitude value of an input signal, converting the calculated amplitude value into N bit digital data, and outputting M upper bits and L remaining lower bits of the N bit digital data;
    a complex multiplier for executing a complex arithmetic operation by receiving the input signal as one input and interpolation data as the other input and outputting the result to said power amplifier;

a selecting circuit for receiving output data having the M upper bits from said amplitude converter and data obtained by adding 1 to the M upper bit output data, and selectively outputting M−1 upper bits of the M upper bits in accordance with whether a value of the M upper bits is an even number or odd number;

a first memory which stores a nonlinear inverse characteristic of said power amplifier, receives output data having the M−1 upper bits from said amplitude converter if the M upper bit data is an even number, and outputs a first corresponding value having a value of the M−1 upper bits as an address;

a second memory which stores the same nonlinear inverse characteristic of said power amplifier, receives output data having the M−1 upper bits from said amplitude convener if the M upper bit data is an odd number, and outputs a second corresponding value having a value of the M−1 upper bits as an address; and an interpolation circuit for receiving outputs from said first and second memories, output data having the L lower bits, and a least significant bit of the M upper bits, and, on the basis of the inputs, outputting interpolation data corresponding to the input signal to said complex multiplier.

6. A circuit according to claim 5, wherein letting X1+jY1 be a corresponding output of said first memory, X2+jY2 be a corresponding output of said second memory, and AL be an L lower bit output of the amplitude value, (a) if the least significant bit of the M upper bits is 0, said interpolation circuit performs an arithmetic operation indicated by $$X+jY=(X1+jY1)*(1-AL/2L)+(X2+jY2)*AL/2L$$

and outputs a value (X,Y), and, (b) if the least significant bit of the M upper bits is 1, said interpolation circuit performs an arithmetic operation indicated by $$X+jY=(X2=jY2)*(AL/2L)+(X1+jY1)*AL/2L$$

and outputs a value (X,Y).

7. A circuit according to claim 6, further comprising:

feedback means for extracting a signal for feedback from an output from said power amplifier, and outputting the extracted signal as a feedback signal of the same type as the input signal;

calculating means for calculating a now distortion compensation value on the basis of the feedback signal, the input signal, and a nonlinear inverse characteristic distortion compensation value used in distortion compensation of the input signal; and updating means for updating a corresponding distortion compensation value of the nonlinear inverse characteristic by the calculated new distortion compensation value.

8. A circuit according to claim 5, further comprising:

feedback means for extracting a signal for feedback from an output from said power amplifier, and outputting the extracted signal as a feedback signal of the same type as the input signal;

calculating means for calculating a new distortion compensation value on the basis of the feedback signal, the input signal, and a nonlinear inverse characteristic distortion compensation value used in distortion compensation of the input signal; and updating means for updating a corresponding distortion compensation value of the nonlinear inverse characteristic by the calculated new distortion compensation value.

9. A predistortion type nonlinear distortion compensating circuit which is placed before a power amplifier having a distortion characteristic, and outputs to said power amplifier a compensation signal obtained by distorting an input signal by a distortion compensation value corresponding to an amplitude of the input signal, comprising:

an amplitude converter for calculating an amplitude value of an input signal, converting the calculated amplitude value into N bit digital data, and outputting M upper bits and L remaining lower bits of the N bit digital data;

two multipliers each for receiving one of a pair input signals as one input;

a complex multiplier for executing a complex arithmetic operation by receiving outputs from said two multipliers as one input and interpolation data as the other input, and outputting the result to said power amplifier;

a selecting circuit for receiving output data having the M upper bits from said amplitude converter and data obtained by adding 1 to the M upper bit output data, and selectively outputting M−1 upper bits of the M upper bits in accordance with whether a value of the M upper bits is an even number or odd number;

a first memory which stores a nonlinear inverse characteristic of said power amplifier, receives output data having the M−1 upper bits from said amplitude converter if the M upper bit data is an even number; and outputs a first corresponding value having a value of the M−1 upper bits as an address;

a second memory which stores the same nonlinear inverse characteristic of said power amplifier, receives output data having the M−1 upper bits from said amplitude convetter if the M upper bit data is an odd number, and outputs a second corresponding value having a value of the M−1 upper bits as an address;

an interpolation circuit for receiving outputs from said first and second memories, output data having the U lower bits, and a least significant bit of the M upper bits, and, on the basis of the inputs, outputting to each of said two multipliers an amplitude component of interpolation data corresponding to the input signal, and outputting a phase component of the interpolation data; and a cos converter and sin converter for converting the phase component output from said interpolation circuit and outputting as the other input to said complex multiplier.

10. A circuit according to claim 9, wherein letting R1 and θ1 be an output of said first memory, R2 and θ2 be an 6utput of said second memory, and AL be an L lower bit output of the amplitude value, (a) if the least significant bit of the M upper bits is 0, said interpolation circuit performs an arithmetic operation indicated by $$R=R1*(1-AL/2L)+R2*AL/2L$$

$$\theta=\theta1*(1-AL/2L)+\theta2*AL/2L$$

and outputs a value (R,θ), and, (b) if the least significant bit of the M upper bits is 1, said interpolation circuit performs an arithmetic operation indicated by $$R=R2*(1-AL/2L)+AL/2L$$

$$\theta=\theta2*(1-AL/2L)+\theta1*AL/2L$$

and outputs a value (R,θ).

11. A circuit according to claim 10, further comprising:

feedback means for extracting a signal for feedback from an output from said power amplifier, and outputting the extracted signal as a feedback signal of the same type as the input signal;

calculating means for calculating a new distortion compensation value on the basis of the feedback signal, the input signal, and a nonlinear inverse characteristic distortion compensation value used in distortion compensation of the input signal; and updating means for updating a corresponding distortion compensation value of the nonlinear inverse characteristic by the calculated new distortion compensation value.

12. A circuit according to claim 9, further comprising:

feedback means for extracting a signal for feedback from an output from said power amplifier, and outputting the extracted signal as a feedback signal of the same type as the input signal;

calculating means for calculating a new distortion compensation value on the basis of the feedback signal, the input signal, and a nonlinear inverse characteristic distortion compensation value used in distortion compensation of the input signal; and updating means for updating a corresponding distortion compensation value of the nonlinear inverse characteristic by the calculated new distortion compensation value.

* * * * *